(12) United States Patent
Cha

(10) Patent No.: US 11,018,325 B2
(45) Date of Patent: May 25, 2021

(54) ORGANIC LIGHT EMITTING DIODE DISPLAY

(71) Applicant: Samsung Display Co., Ltd., Yongin-Si (KR)

(72) Inventor: Jae-lok Cha, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/743,090

(22) Filed: Jan. 15, 2020

(65) Prior Publication Data

US 2020/0152920 A1 May 14, 2020

Related U.S. Application Data

(63) Continuation of application No. 15/623,487, filed on Jun. 15, 2017, now Pat. No. 10,573,848.

(30) Foreign Application Priority Data

Jun. 17, 2016 (KR) .......................... 10-2016-0075942

(51) Int. Cl.
*H01L 51/52* (2006.01)
*H01L 51/56* (2006.01)
*H01L 27/32* (2006.01)

(52) U.S. Cl.
CPC ...... *H01L 51/5284* (2013.01); *H01L 51/5281* (2013.01); *H01L 51/56* (2013.01); *H01L 27/3244* (2013.01); *H01L 2251/303* (2013.01)

(58) Field of Classification Search
CPC .. H01L 27/3244; H01L 51/5281; H01L 51/56
See application file for complete search history.

(56) References Cited

U.S. PATENT DOCUMENTS

| 2006/0124940 A1 | 6/2006 | Miyazawa | H01L 27/322 257/79 |
| 2007/0207571 A1 | 9/2007 | Morisue | H01L 27/1214 438/107 |

(Continued)

FOREIGN PATENT DOCUMENTS

| KR | 1020140111068 A | 9/2014 |
| KR | 1020150048376 A | 5/2015 |

(Continued)

*Primary Examiner* — Eugene Lee
(74) *Attorney, Agent, or Firm* — Cantor Colburn LLP

(57) ABSTRACT

An organic light emitting diode display includes an organic light emitting display panel including an upper surface receiving first incident light from outside and a lower surface opposite to the upper surface, a light transmission preventing layer including a base layer and an adhesive layer which is between the base layer and the organic light emitting display panel and bonded thereto, the adhesive layer including a facing surface facing the lower surface and a plurality of patterns protruded from the facing surface toward the organic light emitting display panel to define a plurality of gaps between the lower surface and the facing surface. The adhesive layer includes a light blocking material blocking second incident light which passes through the organic light emitting display panel to the light transmission preventing layer from among the first incident light received by the upper surface of the organic light emitting display panel.

11 Claims, 6 Drawing Sheets

(56) References Cited

U.S. PATENT DOCUMENTS

| | | | |
|---|---|---|---|
| 2010/0302803 A1 | 12/2010 | Bita | G02B 6/0036 362/606 |
| 2012/0242565 A1* | 9/2012 | Noh | G02F 1/133514 345/107 |
| 2015/0177584 A1 | 6/2015 | Shi | G02F 1/153 359/267 |
| 2015/0200380 A1 | 7/2015 | Huang | H01L 51/0003 257/40 |
| 2016/0138779 A1 | 5/2016 | Oh | G02F 1/133603 362/97.1 |
| 2017/0294614 A1 | 10/2017 | Jia | H01L 27/32 |
| 2018/0024404 A1 | 1/2018 | Suzuki | H01L 51/5268 362/84 |
| 2018/0031909 A1 | 2/2018 | Liu | B05D 1/005 |
| 2018/0088404 A1* | 3/2018 | Chae | G02F 1/133514 |
| 2018/0149941 A1 | 5/2018 | Gu | G02F 1/153 |
| 2019/0107765 A1* | 4/2019 | Whitehead | G02B 26/005 |
| 2019/0219875 A1* | 7/2019 | Jung | H01L 51/5275 |

FOREIGN PATENT DOCUMENTS

| | | |
|---|---|---|
| KR | 1020150078330 A | 7/2015 |
| KR | 1020160030599 A | 3/2016 |

\* cited by examiner

ORGANIC LIGHT EMITTING DIODE DISPLAY

This application is a continuation application of U.S. application Ser. No. 15/623,487 filed on Jun. 15, 2017, which claims priority to Korean Patent Application No. 10-2016-0075942, filed on Jun. 17, 2016, and all the benefits accruing therefrom under 35 U.S.C. § 119, the content of which in its entirety is hereby incorporated by reference.

BACKGROUND

(1) Field

The present disclosure herein relates to an organic light emitting diode display which reduces or effectively prevents transmission of light entering from outside the organic light emitting diode display.

(2) Description of the Related Art

An organic light emitting diode ("OLED") is a self-luminous diode and has a relatively wide viewing angle and high contrast ratio. In addition, the organic light emitting diode has relatively short response times.

An OLED display which displays an image uses the self-luminous organic light emitting diode and therefore does not include a separate light source unlike a liquid crystal display. As such, the OLED display is relatively thin and light as compared to the liquid crystal display. The OLED display may be classified into a top-emitting OLED display or a bottom-emitting OLED display which emits generated light at the top or bottom thereof, respectively.

SUMMARY

One or more embodiment provides an organic light emitting diode display including a functional layer which effectively blocks or extinguishes incident light entering from outside the organic light emitting diode display.

An embodiment of the invention provides an organic light emitting diode display including: an organic light emitting display panel including an upper surface which receives first incident light from outside the organic light emitting display panel and a lower surface which is opposite to the upper surface; and a light transmission preventing layer disposed at the lower surface of the organic light emitting display panel, the light transmission preventing layer including a base layer disposed under the lower surface of the light emitting display panel and an adhesive layer disposed between the lower surface of the organic light emitting display panel and the base layer and bonded to the lower surface of the organic light emitting display panel, the adhesive layer including a facing surface facing the lower surface of the organic light emitting display panel and a plurality of patterns protruded from the facing surface toward the organic light emitting display panel to define a plurality of gaps between the lower surface of the organic light emitting display panel and the facing surface of the adhesive layer. The adhesive layer includes a light blocking material which blocks second incident light which passes through the organic light emitting display panel to the light transmission preventing layer from among the first incident light received by the upper surface of the organic light emitting display panel.

In an embodiment, the light blocking material may include a first light blocking material which absorbs the second incident light or a second light blocking material which reflects the second incident light.

In an embodiment, the first light blocking material may include carbon black, graphite powder, gravure ink, black spray or black enamel.

In an embodiment, the second light blocking material may include titanium dioxide ($TiO_2$).

In an embodiment, the organic light emitting display panel may be disposed in a plane parallel to a plane defined by a first direction and a second direction which crosses at right angles to the first direction, and the plurality of patterns may protrude toward the lower surface of the organic light emitting display panel in a third direction crossing the first and second directions.

In an embodiment, each protrusion among the plurality of protrusions may have a cross section in a plane defined by the first direction and the third direction, and the cross section may have a shape of a trapezoid, a circle, or a triangle.

In an embodiment, the cross section of the each protrusion among the plurality of protrusions may have a shape of a trapezoid and define an upper surface of the each protrusion parallel to the facing surface of the adhesive layer, and each of the plurality of upper surfaces of the plurality of protrusions may be bonded to the lower surface of the organic light emitting display panel.

In an embodiment, the organic light emitting diode display may further include a lower member which is disposed under the light transmission preventing layer and supports the organic light emitting display panel on the light transmission preventing layer, and a light blocking layer disposed between the lower member and the light transmission preventing layer, the light blocking layer including a third light blocking material which absorbs third incident light which is leaked from the light transmission preventing layer among the second incident light which passes to the light transmission preventing layer from the organic light emitting display panel.

In an embodiment, the lower member and the light transmission preventing layer may be coupled to each other by the light blocking layer.

In an embodiment, a total thickness of the light blocking layer disposed between the lower member and the light transmission preventing layer is at least about 3 micrometers ($\mu m$).

In an embodiment, the organic light emitting diode display may further include a sub-adhesive layer which bonds the light blocking layer and the lower member to each other.

In an embodiment, the third light blocking material may include carbon black, graphite powder, gravure ink, black spray or black enamel.

In an embodiment of the invention, an organic light emitting diode display includes an organic light emitting display panel including an upper surface which receives first incident light from outside the organic light emitting display panel and a lower surface which is opposite to the upper surface, a light transmission preventing layer disposed at the lower surface of the organic light emitting display panel, the light transmission preventing layer including a base layer disposed under the lower surface of the light emitting display panel and a first adhesive layer disposed between the lower surface of the organic light emitting display panel and the base layer and bonded to the organic light emitting display panel, the adhesive layer including a facing surface facing the lower surface of the organic light emitting display panel and a plurality of patterns protruded from the facing surface toward the organic light emitting display panel to define a plurality of gaps between the lower surface of the organic light emitting display panel and the facing surface of the adhesive layer, a supporting member which is disposed under the light transmission preventing layer and supports the organic light emitting display panel, and a second adhesive layer which bonds the light transmission preventing layer and the lower member to each other. The first adhesive layer includes a light blocking material which blocks second incident light which passes through the organic light emitting display panel to the light transmission preventing layer from among the first incident light received by the upper surface of the organic light emitting display panel, and the second adhesive layer includes a light blocking material which blocks third incident light which is leaked from the light transmission preventing layer among the second incident light which passes to the light transmission preventing layer from the organic light emitting display panel.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain principles of the invention. In the drawings.

DETAILED DESCRIPTION

Figure 1:
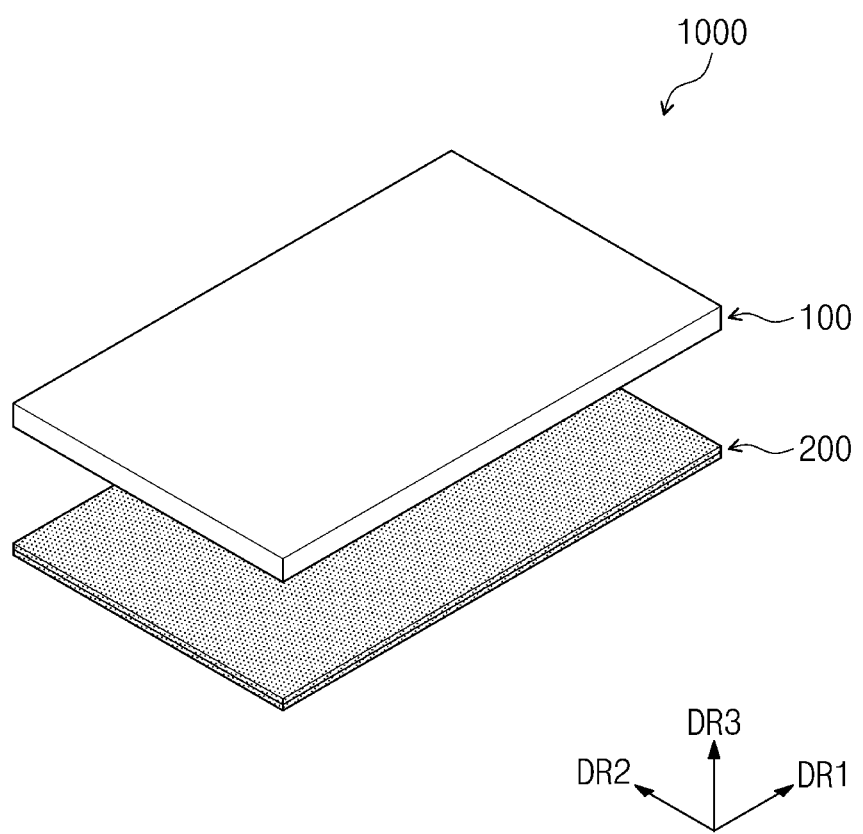
FIG. 1 is a perspective view of an embodiment of an organic light emitting diode display in accordance with the present disclosure.

The invention may be variously modified and embodied in different various forms, and thus specific embodiments will be exemplified in the drawings and described in detail hereinbelow. However, the invention is not limited to the specific disclosed forms, and needs to be construed to include all modifications, equivalents, or replacements included in the spirit and technical range of the invention.

It will be understood that when an element is referred to as being "on" another element, it can be directly on the other element or intervening elements may be present therebetween. In contrast, when an element is referred to as being "directly on" another element, there are no intervening elements present. As used herein, when an element is referred to as being "connected," such connection may be a physical, mechanical and/or fluid connection between elements.

In describing each drawing, similar reference numerals were used for similar elements. It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the invention.

Expressions in singular forms include expressions in plural forms unless the context clearly indicates otherwise. The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items.

In this application, terms "comprise" or "have" are intended to designate features, numbers, steps, operations, elements, parts or combinations thereof described in the specifications of the present disclosure but not to exclude the possibility of the presence or the addition of one or more other features, numbers, steps, operations, elements, parts or combinations thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the present disclosure will be described in detail with reference to the drawings.

Since an organic light emitting diode ("OLED") display transmits incident light entering from outside thereof, contrast ratio may be significantly decreased depending on the luminous intensity of the incident light. Therefore, a light blocking layer or a light blocking tape may be disposed under a display panel of the OLED display to reduce or effectively prevent contrast ratio from being decreased due to the incident light.

Figure 2:
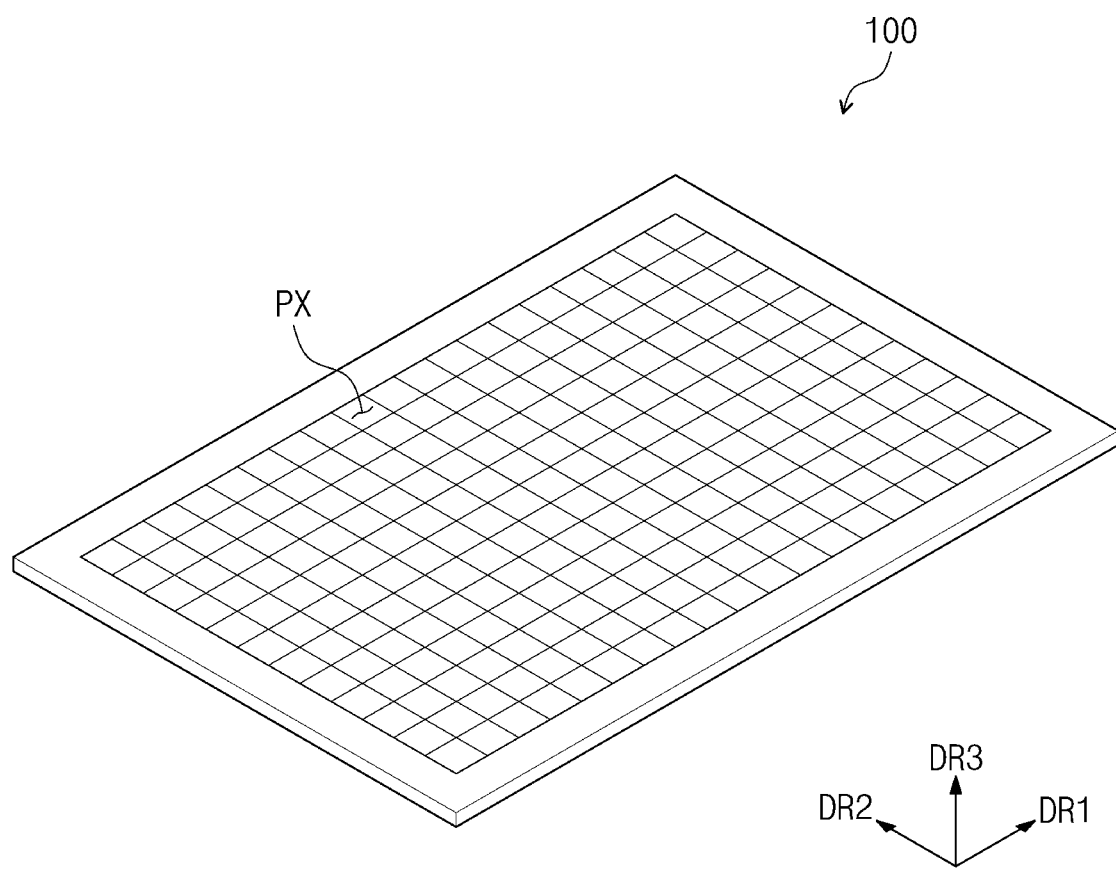
FIG. 2 is a perspective view of an embodiment of an organic light emitting display panel of an organic light emitting diode display in accordance with the present disclosure.
Figure 3:
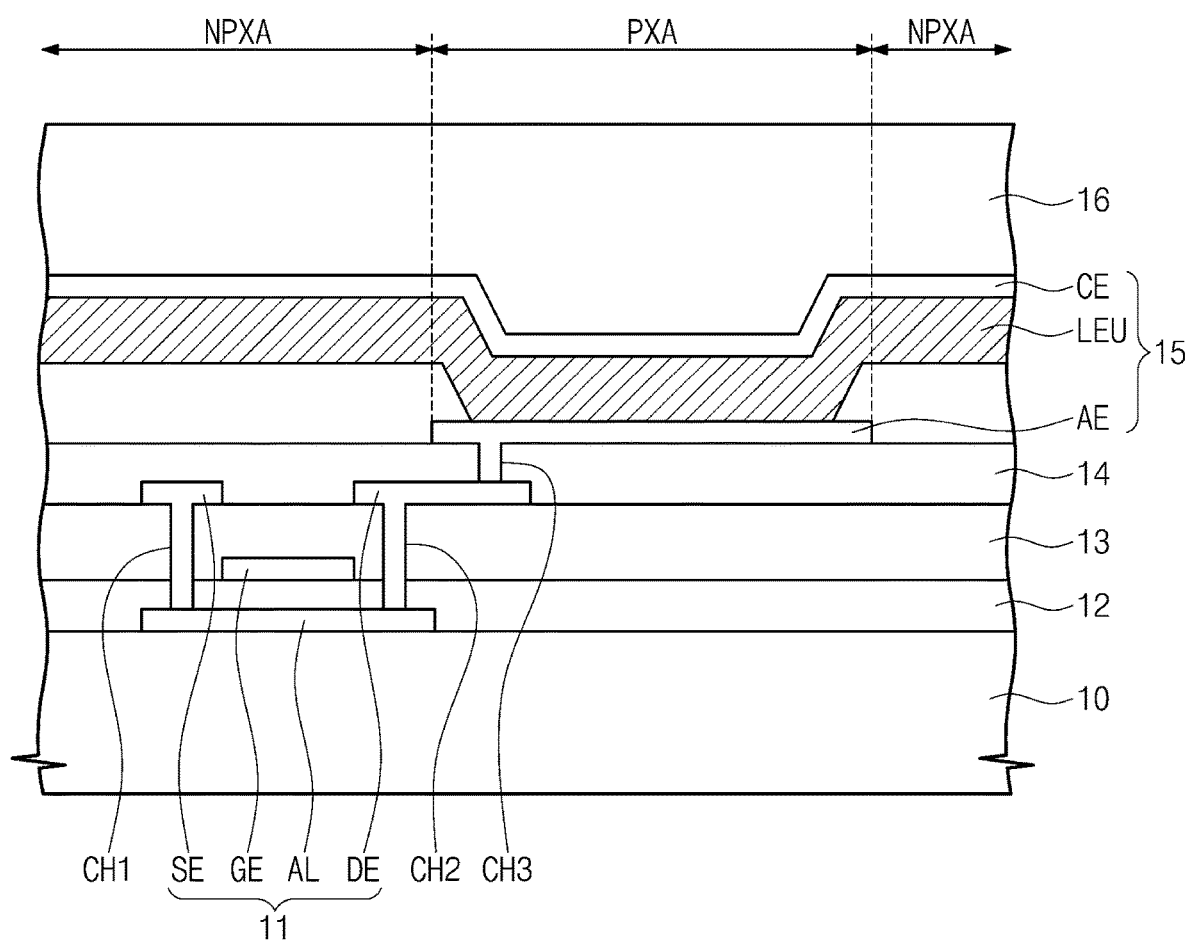
FIG. 3 is a cross-sectional view of an embodiment of a portion of a pixel in an organic light emitting diode display in accordance with the present disclosure.

FIG. 1 is a perspective view of an embodiment of an organic light emitting diode display 1000 according to the present disclosure. FIG. 2 is a perspective view of an embodiment of an organic light emitting display panel 100 according to the present disclosure and FIG. 3 is a cross-sectional view of an embodiment of a portion of a pixel PX included in the organic light emitting diode display 1000 according to the present disclosure.

Referring to FIG. 1, an embodiment of the organic light emitting diode display 1000 according to the present disclosure may include the organic light emitting display panel 100 and a light transmission preventing layer 200.

The embodiment of the organic light emitting display panel 100 according to the present disclosure includes an upper surface and a lower surface which are opposite to and parallel to each other. The upper surface and the lower surface may be parallel to a plane defined by a first direction DR1 and a second direction DR2 which crosses at right angles to the first direction DR1. The embodiment of the organic light emitting display panel 100 according to the present disclosure may adopt a top-emission method in which light generated therein is emitted to and through an upper surface thereof or a bottom-emission method in which light generated therein is emitted to and through a lower surface thereof. Hereinafter, a top-emission type organic light emitting display panel emitting generated light to and through an upper surface thereof will be described. In this case, the upper surface of the organic light emitting display panel 100 may receive first incident light entering from outside.

As shown in FIG. 2, the embodiment of the organic light emitting display panel 100 according to of the present disclosure may include a pixel PX provided in plurality arranged along the first direction DR1 and along the second direction DR2, respectively. Each of the plurality of pixels PX includes an organic light emitting diode and may generate and emit light having a predetermined wavelength range toward a third direction DR3 which crosses at right angles to the first direction DR1 and the second direction DR2, respectively. In an embodiment, for example, each of the plurality of pixels PX may emit one of red, blue, green or white light, but is not limited thereto. The third direction DR3 may be referred to as a thickness direction of the organic light emitting display panel 100 and/or the organic light emitting diode display 1000.

Referring to FIG. 3, the organic light emitting display panel 100 includes a base substrate 10 and a thin film sealing layer 16. Each of the plurality of pixels PX is disposed or defined on the base substrate 10 and may be covered by the thin film sealing layer 16. The pixel PX may include a pixel display area PXA at which light or an image is generated and/or displayed, and a pixel non-display area NPXA at which the light or image is not generated or displayed.

The pixel PX may include a transistor 11, insulating layers 12, 13 and 14, and an organic light emitting diode 15, but is not limited thereto. In other embodiments, some elements of the above-described configuration may be changed or eliminated.

The base substrate 10 may include a flexible plastic substrate including or made of polyimide, a glass substrate or a metal substrate. On the base substrate 10, a semiconductor pattern AL of the transistor 11 is disposed. The semiconductor pattern AL may include amorphous silicon formed at low temperature in an embodiment of a method of manufacturing the organic light emitting diode display 1000. In addition, the semiconductor pattern AL may include a metal oxide semiconductor. Although not shown separately, functional layers may further be disposed on the upper surface of the base substrate 10 on which other elements are disposed. The functional layers include at least one of a barrier layer and a buffer layer. The semiconductor pattern AL may be disposed on the barrier layer or the buffer layer, to dispose such functional layer between the base substrate 10 and the semiconductor pattern AL.

A first insulating layer 12 covering the semiconductor pattern AL is disposed on the base substrate 10. The first insulating layer 12 includes an organic film and/or an inorganic film. Particularly, the first insulating layer 12 may include a plurality of inorganic films. Each of the plurality of inorganic films may include a silicon nitride layer or a silicon oxide layer.

A control electrode GE of the transistor 11 is disposed on the first insulating layer 12. The control electrode may be manufactured according to a photolithography process in an embodiment of a method of manufacturing the organic light emitting diode display 1000. A second insulating layer 13 covering the control electrode GE is disposed on the first insulating layer 12. The second insulating layer 13 includes an organic film and/or an inorganic film. Particularly, the second insulating layer 13 may include a plurality of inorganic films. Each of the plurality of inorganic films may include a silicon nitride layer or a silicon oxide layer.

An input electrode SE and an output electrode DE of the transistor 11 are disposed on the second insulating layer 13. The input electrode SE and the output electrode DE are connected respectively to the semiconductor pattern AL at and through a first through-hole CH1 and a second through-hole CH2, both of which pass through the first insulating layer 12 and the second insulating layer 13.

A third insulating layer 14 which covers the input electrode SE and the output electrode DE is disposed on the second insulating layer 13. The third insulating layer 14 includes an organic film and/or an inorganic film. Particularly, the third insulating layer 14 may include an organic material to provide a flat surface.

According to the embodiment, the organic light emitting diode 15 may include an anode AE, a light emitting unit LEU and a cathode CE. The light emitting unit LEU may be provided in plurality across the base substrate 10, such as being disposed in a plurality of pixels PX. The common electrode CE may extend across the base substrate 10 to be commonly disposed with the plurality of light emitting units LEU at the plurality of pixels PX. The anode AE may be disposed only at the pixel display area PXA, but is not limited thereto.

The anode AE is connected to the output electrode DE at and through a third through-hole CH3 which passes through the third insulating layer 14. Although not shown in the drawing, the light emitting unit LEU may include an organic light emitting layer generating light having a predetermined wavelength range, an electron control layer providing electrons to the organic light emitting layer, and a hole control layer providing holes to the organic light emitting layer. The organic light emitting layer may include a light emitting material generating, for example, red, green and/or blue light, and may further include a fluorescent material or phosphor. The electron control layer may include an electron transport material transporting an electron to the organic light emitting layer, and a hole blocking layer. Also, the hole control layer may include a material for injecting and transporting a hole to the organic light emitting layer.

The cathode CE is disposed in a normal direction of the anode AE (e.g., vertical in FIG. 3 as being in the third direction DR3) while being spaced therefrom. The light emitting unit LEU is disposed between the anode AE and the cathode CE which are spaced apart from each other in the thickness direction.

The thin film sealing layer 16 may be disposed on the cathode CE. The thin film sealing layer 16 may include a plurality of organic layers and/or a plurality of inorganic layers. The thin film sealing layer 16 may include a laminate of a lithium fluoride layer/an aluminum oxide layer/an organic monomer layer (for example, including an acrylate-based monomer)/a silicon nitride layer/an organic monomer layer/a silicon nitride layer. The thin film sealing layer 16 may protect the cathode CE and the light emitting unit LEU from external moisture. Although not shown separately, a predetermined optical layer may further be included under the thin film sealing layer 16 at the side of the cathode CE, to enhance light extraction efficiency and reduce or prevent external light incident to the organic light emitting display panel 100 from being reflected therefrom.

Although not shown in the drawing, a color filter for transmitting light having a specific wavelength range, and/or a black matrix may further be disposed on the thin film sealing layer 16.

Referring back to FIG. 1, the embodiment of the light transmission preventing layer 200 according to the present disclosure is disposed under the light emitting display panel 100 and may be bonded to the lower surface of the organic light emitting display panel 100. In FIG. 1, the third direction DR3 may be a viewing direction or image display direction, and a direction opposite to the third direction DR3 may be a direction towards the lower surface of the organic light emitting display panel 100. From among the first incident light received by the upper surface of the organic light emitting display panel 100 from outside thereof (e.g., at the viewing side), the embodiment of the light transmission preventing layer 200 according to the present disclosure may block second incident light which is light that passes through the organic light emitting display panel 100. In an embodiment, for example, the light transmission preventing layer 200 may block the second incident light from further transmitting through the light transmission preventing layer 200, by either absorbing or reflecting the second incident light which has passed through the organic light emitting display panel 100 to the light transmission preventing layer 200.

Figure 4:
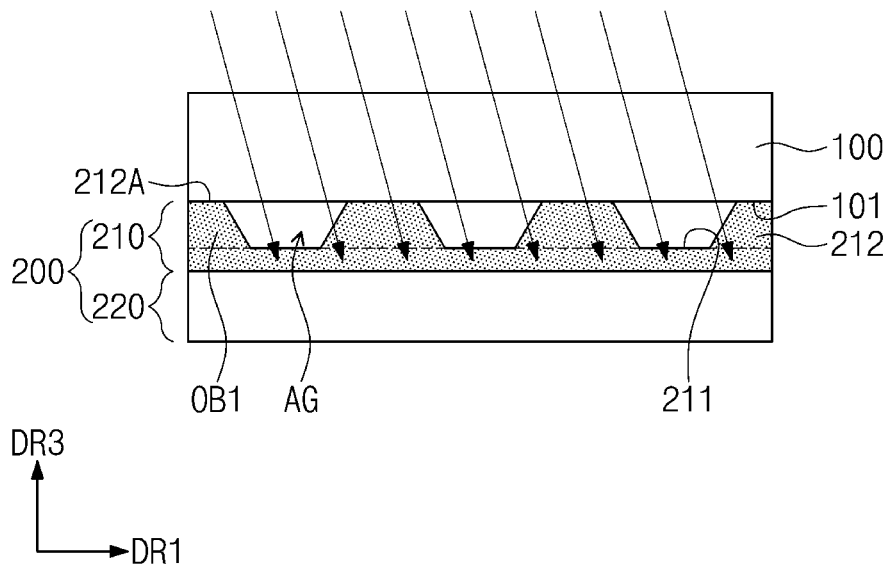
FIG. 4 and FIG. 5 are cross-sectional views of embodiments of a light transmission preventing layer of an organic light emitting diode display in accordance with the present disclosure.
Figure 5:
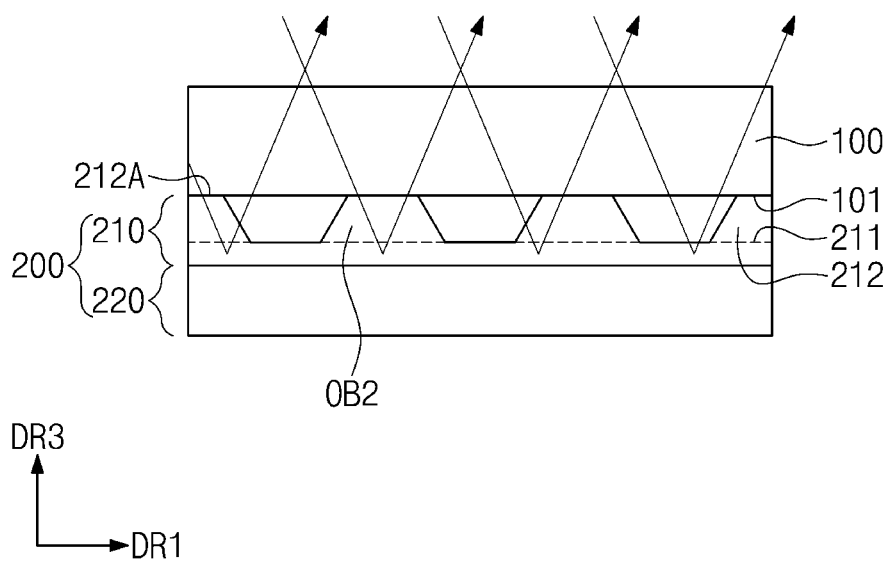

FIG. 4 and FIG. 5 are cross-sectional views of embodiments of a light transmission preventing layer, relative to an organic light emitting display panel, according to the present disclosure.

Referring to FIG. 4 and FIG. 5, the embodiment of the light transmission preventing layer 200 according to the present disclosure may include a base layer 220 and an adhesive layer 210.

The base layer 220 may be disposed under the organic light emitting display panel (see 100 of FIG. 1). The base layer 220 may provide the adhesive layer 210 with a flat upper surface on which to be disposed. The embodiment of the base layer 220 according to the present disclosure may include or be made of, but not limited to, for example, polyethylene terephthalate ("PET"), oriented poly propylene ("OPP") or chlorinated polyethylene.

The adhesive layer 210 may be disposed on the base layer 220 and be bonded to a lower surface 101 of the organic light emitting display panel 100 which is opposite to the upper surface of the organic light emitting display panel 100 at which the first incident light is received. The adhesive layer 210 may include or be made of, for example, an acrylic adhesive, but not limited thereto. The adhesive layer 210 may include a facing surface 211 facing the lower surface 101 of the organic light emitting display panel 100.

The embodiment of the adhesive layer 210 according to the present disclosure may include a pattern provided in plurality and defining a plurality of spaces (e.g., air gap AG) between the lower surface 101 and the facing surface 211. The facing surface 211 is disposed common to each of the patterns. The embodiment of the adhesive layer 210 according to the present disclosure may reduce or prevent bubbles from being generated when the light transmission preventing layer 200 is bonded to the lower surface 101 of the organic light emitting display panel 100, by defining the air gap AG in plurality.

The plurality of patterns may include, for example, a protrusion 212 provided in plurality each protruded toward the lower surface 101 of the organic light emitting display panel 100 from the facing surface 211. The adhesive layer 210 may include a base layer as a portion thereof excluding the plurality of protrusions 212 protruded toward the lower surface 101 of the organic light emitting display panel 100. The plurality of protrusions 212, as shown in FIG. 4 and FIG. 5, may each have trapezoid-shaped cross sections defined by the first direction DR1 and the third direction DR3, within the light transmission preventing layer 200. However, the plurality of protrusions 212 may define the plurality of air gaps AG between the facing surface 211 and the lower surface 101 and have various shapes as long as the adhesive strength thereof is not weakened. That is, the plurality of protrusions 212 may have cross sections having various shapes, such as a triangle, a circle, an oval and the like. Hereinafter, an embodiment of which the plurality of protrusions 212 have trapezoid-shaped cross sections will be explained.

In an embodiment, the plurality of protrusions 212 according to the present disclosure may be arranged in the first direction DR1 and in the second direction DR2, respectively. In an embodiment, for example, the plurality of protrusions 212 may form an embossing pattern in a plane defined by the first direction DR1 and the second direction DR2. In this case, the plurality of air gaps AG defined between the plurality of protrusions 212 arranged in the first and second directions DR1 and DR2, and the lower surface 101 of the organic light emitting display panel 100, may be connected to each other in the first and/or second directions DR1 and DR2 to define a single, continuous collective space, but is not limited thereto. In another embodiment, the plurality of air gaps AG defined between the plurality of protrusions 212 arranged in the first and second directions DR1 and DR2, and the lower surface 101 of the organic light emitting display panel 100, may not be connected to each other in the first and/or second directions DR1 and DR2 to be separated (e.g., disconnected) from each other by the plurality of protrusions 212.

In an embodiment, each of the plurality of protrusions 212 according to the present disclosure may have or define an upper surface 212A thereof parallel to the facing surface 211. Here, each of the plurality of upper surfaces 212A may be bonded to the lower surface 101 of the organic light emitting display panel 100.

Further, the embodiment of the adhesive layer 210 according to the present disclosure may include a light blocking material which blocks transmission of the second incident light incident thereto. In one embodiment, referring to FIG. 4, the adhesive layer 210 may include a first light blocking material OB1 which absorbs the second incident light which has passed through the organic light emitting display panel 100 to the light transmission preventing layer 200. The second incident light shown by arrows in FIG. 4, terminates at the light transmission preventing layer 200 to be absorbed thereby. The first light blocking material OB1 may be, for example, carbon black, graphite powder, Gravure ink, black spray or black enamel.

Further, in another embodiment, as shown in FIG. 5, the adhesive layer 210 may include a second light blocking material OB2 which reflects the second incident light which has passed through the organic light emitting display panel 100 to the light transmission preventing layer 200. The second incident light shown by arrows in FIG. 5, reverses direction at the base layer of the adhesive layer 210 to be reflected. The second light blocking material OB2 may be titanium dioxide $TiO_2$.

Generally, when a conventional adhesive layer disposed under an organic light emitting display panel to prevent generation of bubbles includes a plurality of patterns defining a plurality of air gaps, incident light which passes through a region of the adhesive layer having a plurality of air gaps and incident light which passes through a region of the adhesive layer not having a plurality of air gaps may have different transmittance from each other. Such different transmittance of the incident light may cause visibility limitation due to a plurality of reflection patterns being visible at the organic light emitting display panel.

Therefore, the adhesive layer 210 according to one or more embodiment of the present disclosure includes the first light blocking material OB1 or the second light blocking material OB2 to compensate for the transmittance difference of the second incident light at regions having and not having the air gap. That is, one or more embodiment of the organic light emitting diode display 1000 according to the present disclosure may resolve the phenomenon of non-uniform reflected patterns and the visibility limitation caused due to the transmittance difference of the second incident light, either by absorbing the second incident light using the first light blocking material OB1 (FIG. 4) or by reflecting second incident light using the second light blocking material OB2 (FIG. 5).

In FIG. 4 and FIG. 5, a total overall thickness in the third direction DR3 of the organic light emitting display panel 100 and a total overall thickness of the light transmission preventing layer 200 in the third direction DR3 are similarly illustrated to stress the structure of the light transmission preventing layer 200. However, in embodiments, the light transmission preventing layer 200 may be approximately 20 micrometers (μm) to approximately 40 μm in total overall thickness, which is less than that of the organic light emitting display panel 100 by equal to or more than a predetermined thickness.

Figure 6A:
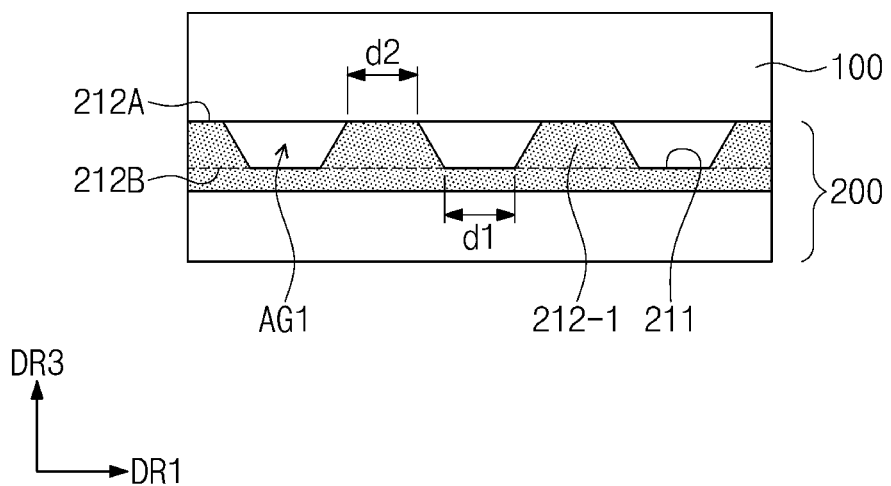
FIG. 6A and FIG. 6B are cross-sectional views of embodiments of an adhesive layer of an organic light emitting diode display in accordance with the present disclosure.
Figure 6B:
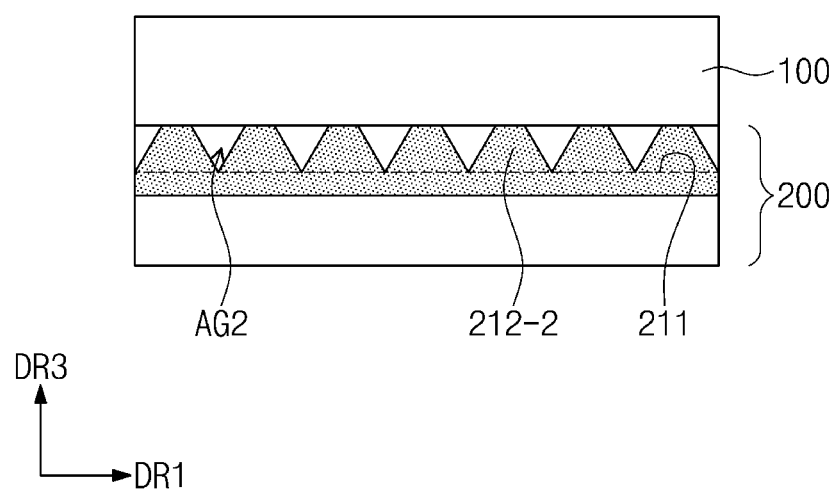

FIG. 6A and FIG. 6B are cross-sectional views of embodiments of an adhesive layers including a plurality of patterns, relative to an organic light emitting display panel, according to the present disclosure. The adhesive layers represented in FIG. 6A and FIG. 6B may include any of the materials described above and illustrated in FIG. 4 and FIG. 5.

The plurality of patterns formed in or by the adhesive layer 210 according to an embodiment of the present disclosure may have cross sections having various sizes and shapes as described before. Also, the plurality of patterns according to an embodiment of the present disclosure may be disposed having various intervals along the facing surface 211 of the adhesive layer 210 which is parallel to a plane defined by the first direction DR1 and the second direction DR2.

In an embodiment, for example, referring to FIG. 6A, the plurality of patterns may be respectively disposed spaced apart from each other by a predetermined interval d1 along the first direction DR1. That is, surfaces of the adhesive layer which are parallel to the lower surface 101 of the organic light emitting display panel 100 may be respectively disposed or formed between adjacent patterns. The predetermined interval d1 may be set within a variety of values. In one embodiment, the predetermined interval d1 may be disposed or formed to have a same length as a length d2 of an upper surface 212A of each protrusion 212-1. As shown in FIG. 6A, when the protrusion 212-1 is disposed or formed protruded in plurality from the facing surface 211, a plurality of air gaps AG1 may be defined by the plurality of protrusions 212-1 in cooperation with the lower surface of the organic light emitting display panel 100. A lower surface 212B of a protrusion 212-2 may be parallel to the upper surface 212A thereof. The lower surface 212B is commonly disposed in a same plane as that of the facing surface 211.

In contrast, referring to FIG. 6B, the plurality of patterns may be disposed right next to each other along the first direction DR1 without forming an interval therebetween. That is, respective lower surfaces 212B (refer to FIG. 6A) of a plurality of protrusions 212-2 which are each parallel to respective upper surface 212A (refer to FIG. 6A) of the plurality of protrusions 212-2 may be connected to each other at the facing surface 211. That is, the facing surface 211 is not exposed between adjacent protrusions 212-2 in FIG. 6B. When the plurality of protrusions 212-2 are disposed or formed as shown in FIG. 6B, a plurality of air gaps AG2 which are defined by the plurality of protrusions 212-2 in cooperation with the lower surface of the organic light emitting display panel 100, may be formed being smaller than the plurality of air gaps AG1 shown in FIG. 6A. Therefore, for the configuration of FIG. 6B, there is an effect that the transmittance difference between the second incident light on a region with the plurality of protrusions 212-2 and on a region without the plurality of protrusions 212-2 may be reduced.

FIG. 6A and FIG. 6B show cross sections of the adhesive layer 210 according to the first direction DR1 and the third direction DR3. However, a cross section of the adhesive layer 210 according to the second direction DR2 and the third direction DR3 of a plurality of protrusions may be substantially identical to a cross section of the adhesive layer 210 according to the first direction DR1 and the third direction DR3. That is, the plurality of protrusions 212-1 and 212-2 may be arranged in the first direction DR1 and in the second direction DR2, respectively, having substantially the same patterns.

Figure 7A:
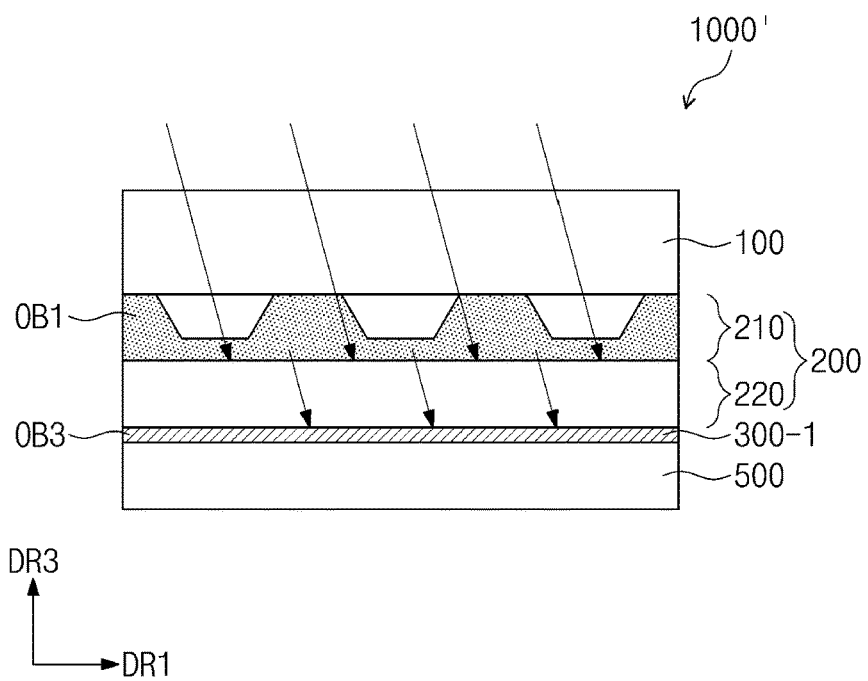
FIG. 7A and FIG. 7B are cross-sectional views of other embodiments of an organic light emitting display in accordance with the present disclosure.
Figure 7B:
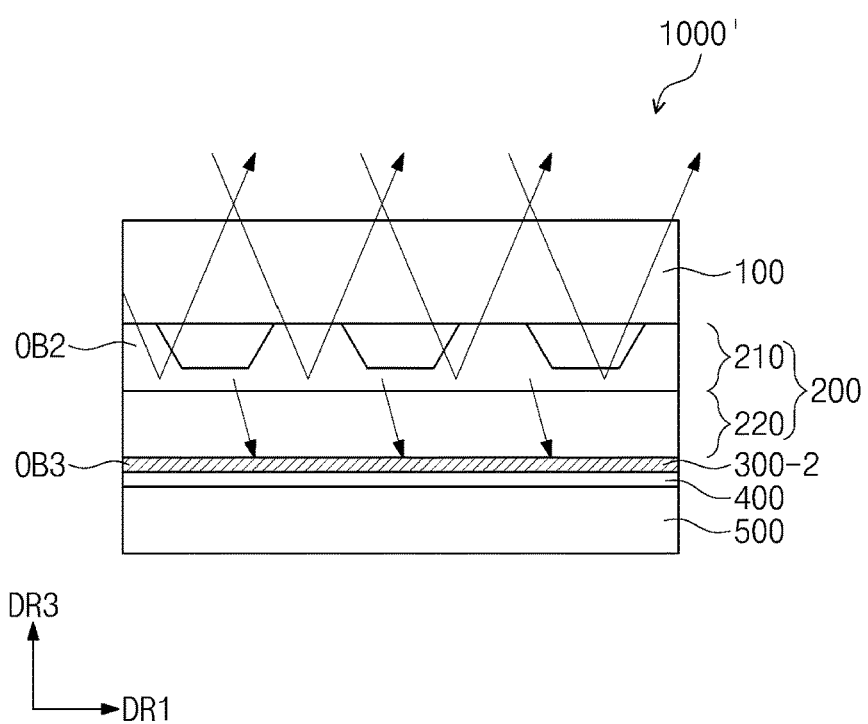

FIG. 7A and FIG. 7B are cross sections of other embodiments of an organic light emitting diode display according to the present disclosure. Hereinafter, a detailed description of the repeated configuration will be omitted.

The organic light emitting diode display 1000' according to embodiments of the present disclosure may include a lower member 500 which is disposed under the organic light emitting display panel 100, and supports and protects the organic light emitting diode display 1000'. The lower member 500 disposes the light transmission preventing layer 200 between the organic light emitting display panel 100 and the lower member 500. The lower member 500 according to the present disclosure may include or be made of a relatively high thermal conductive aluminum (Al), copper (Cu), zinc (Zn), silver (Ag), gold (Au), or metal (Fe), or an alloy thereof. In an embodiment, for example, the lower member 500 according to the present disclosure may include or be made of aluminum which has relatively high thermal conductivity, is relatively light in weight and relatively low-cost, but is not limited thereto.

In addition, the organic light emitting diode display 1000' may further include a light blocking layer between the lower member 500 and the light transmission preventing layer 200.

More specifically, the light blocking layer according to the present disclosure may absorb third incident light leaked from the light transmission preventing layer 200 from among the second incident light which has passed to and through the light transmission preventing layer 200. The light blocking layer may include a third light blocking material OB3 which absorbs the third incident light. The third light blocking material OB3 may be, for example, carbon black, graphite power, Gravure ink, black spray or black enamel. The third light blocking material OB3 may be identical to or different from the first light blocking material OB1.

Referring to FIG. 7A, an embodiment of a light blocking layer 300-1 according to the present disclosure may be an adhesive layer which bonds the lower member 500 and the light transmission preventing layer 200 to each other. In an embodiment, for example, the light blocking layer 300-1 may be a layer including an acrylic adhesive having the third light blocking material OB3. In this case, the light blocking layer 300-1 may be disposed or formed to be approximately 6 μm in total overall thickness.

As shown in FIG. 7A, when the third incident light passes completely through the light transmission preventing layer 200 without being absorbed by the adhesive layer 210 in the light transmission preventing layer 200, the third incident light may be absorbed in the light blocking layer 300-1. The third incident light shown by lower arrows in FIG. 7A, terminates at the light blocking layer 300-1 to be absorbed thereby. Therefore, the phenomenon of non-uniform patterns viewed at the organic light emitting display panel 100 may be reduced or effectively prevented.

Referring to FIG. 7B, between a light blocking layer 300-2 and the lower member 500, a sub-adhesive layer 400 may further be included to bond the light blocking layer 300-2 and the lower member 500 to each other. In this case, the light blocking layer 300-2 may be bonded to the lower member 500 by the sub-adhesive layer 400.

As shown in FIG. 7B, when third incident light passes completely through the light transmission preventing layer 200 without being reflected by the adhesive layer 210 in the light transmission preventing layer 200, the third incident light may be absorbed in the light blocking layer 300-2. The third incident light shown by lower arrows in FIG. 7B, terminates at the light blocking layer 300-2 to be absorbed thereby. Therefore, the phenomenon of non-uniform patterns viewable at the organic light emitting display panel 100 may be reduced or effectively prevented.

Although not shown in the drawing, between the light blocking layer 300-1 or 300-2, and the lower member 500, a functional sheet, for example, a buffer sheet performing a shock-absorbing function against an external shock or a heat radiation sheet performing a heat-dissipating function dissipating heat generated from an organic light emitting display panel to the outside, may be included.

Thus, by including another light blocking layer 300-1 or 300-2 between the light transmission preventing layer 200 and the lower member 500, one or more embodiment of the organic light emitting display panel 100 according to the present disclosure has an effect of reducing the visibility limitation caused due to the phenomenon of non-uniform patterns.

One or more embodiment of the light transmission preventing layer according to the present disclosure may absorb or reflect light incident thereto that has passed through an overlying organic light emitting display panel, among light entering the overlying organic light emitting display panel from outside thereof, to thus reduce the difference in the luminous intensity between a patterned region and a non-patterned region of the light transmission preventing layer. Therefore, a light transmission preventing layer may solve the visibility limitation caused due to reflected patterns visible at the organic light emitting display panel.

While this disclosure has been particularly shown and described with reference to exemplary embodiments thereof, it will be understood by those skilled in the art that various changes in form and details may be made therein without departing from the spirit and scope of the invention as defined by the appended claims. Therefore, the scope of the disclosure is defined not by the detailed description of the invention but by the appended claims.

What is claimed is:
1. A light emitting display comprising:
 a display panel which displays an image with light, the display panel comprising an upper surface which receives first incident light from outside the display panel and a lower surface which is opposite to the upper surface;
 a light transmission preventing layer disposed at the lower surface of the display panel, and
 a light blocking layer disposed at a lower surface of the light transmission preventing layer and comprising a first light blocking material which blocks incident light,
 wherein the light transmission preventing layer comprises:
  a base layer disposed under the lower surface of the display panel, and
  a first adhesive layer disposed between the lower surface of the display panel and the base layer and bonded to the display panel, the first adhesive layer comprising:
   a layer of a second light blocking material which blocks incident light, and
   the layer of the second light blocking material defining both:

a facing surface of the first adhesive layer which faces the lower surface of the display panel and is spaced apart from the lower surface of the display panel, and a plurality of patterns protruded from the facing surface of the first adhesive layer toward the display panel to define a plurality of gaps between the lower surface of the display panel and the facing surface of the first adhesive layer.

2. The light emitting display of claim 1, wherein the second light blocking material of the first adhesive layer blocks second incident light which passes through the display panel to the light transmission preventing layer from among the first incident light received by the upper surface of the display panel.

3. The light emitting display of claim 2, wherein the first light blocking material of the light blocking layer blocks third incident light which is from the light transmission preventing layer among the second incident light which passes to the light transmission preventing layer from the display panel.

4. The light emitting display of claim 1, wherein the first adhesive layer comprises at least one of carbon black, graphite powder, gravure ink, black spray and black enamel.

5. The light emitting display of claim 3, wherein
the second light blocking material of the first adhesive layer absorbs the second incident light or reflects the second incident light, and
the first light blocking material of the light blocking layer absorbs the third incident light.

6. The light emitting display of claim 5, wherein the first light blocking material of the light blocking layer comprises at least one of carbon black, graphite powder, gravure ink, black spray and black enamel.

7. The light emitting display of claim 5, wherein the first light blocking material and the second light blocking material comprises identical material.

8. The light emitting display of claim 5, wherein the second light blocking material different from the first light blocking material.

9. The light emitting display of claim 1, further comprising a lower member which is disposed under the light blocking layer.

10. The light emitting display of claim 9, wherein the light blocking layer further comprises an adhesive material.

11. The light emitting display of claim 1, wherein
the upper and lower surfaces of the display panel are each disposed in planes parallel to a plane defined by a first direction and a second direction which crosses the first direction, and
the plurality of patterns are protruded toward the lower surface of the display panel in a third direction crossing the first and second directions.

* * * * *